United States Patent [19]

Schairer et al.

[11] Patent Number: 4,791,635
[45] Date of Patent: Dec. 13, 1988

[54] HETEROSTRUCTURE SEMICONDUCTOR LASER DIODE

[75] Inventors: Werner Schairer, Weinsberg; Jochen Gerner, Wiesloch, both of Fed. Rep. of Germany

[73] Assignee: Telefunken Electronic GmbH, Heilbronn, Fed. Rep. of Germany

[21] Appl. No.: 13,437

[22] Filed: Feb. 11, 1987

[30] Foreign Application Priority Data

Feb. 12, 1986 [DE] Fed. Rep. of Germany ....... 3604295

[51] Int. Cl.$^4$ .............................................. H01S 3/19
[52] U.S. Cl. ........................................ 372/46; 372/48
[58] Field of Search ....................... 372/46, 45, 44, 48; 357/17

[56] References Cited

U.S. PATENT DOCUMENTS 4,371,966  2/1983  Scifres et al. ......................... 372/46

FOREIGN PATENT DOCUMENTS 0095826  7/1983  European Pat. Off. .
3125847  3/1982  Fed. Rep. of Germany .
2822146  11/1982  Fed. Rep. of Germany .
0161691  8/1985  Japan ..................................... 372/46
2129212  5/1984  United Kingdom .

OTHER PUBLICATIONS

Claus Wölk et al., Criteria for Designing V-Groove Lasers, IEEE Journal of Quantum Electronics, vol. QE-17, No. 5, May 1981, pp. 756-759 and 759-762.

Primary Examiner—James W. Davie
Attorney, Agent, or Firm—Spencer & Frank

[57] ABSTRACT

The invention relates to a heterostructure semiconductor laser diode with a layer sequence formed on a substrate, wherein the layer sequence includes a laser-active zone arranged between layers of respectively opposite conductivity types, and an additional layer and having a cover layer disposed thereon, and both of the same conductivity type as the substrate, formed on the side of the layer sequence facing away from the substrate, and wherein the cover layer includes an oppositely doped semiconductor area which, in a stripe-shaped surface region extending perpendicularly to the exit surface of the laser radiation in the area of the axis of symmetry, and through a v-groove-shaped recess penetrates, the boundary plane between the cover layer and the adjacent additional layer and extends into the layer located thereunder, whereby the current flowing in the forward direction of the semiconductor laser diode is confined to a narrow, strip-shaped area of the laser-active zone. Higher output power and greater long-term stability are attained by the v-groove-shaped recess being made shorter in its longitudinal dimensions than the resonator length and by the laser-active zone being simultaneously highly doped.

6 Claims, 1 Drawing Sheet

U.S. Patent
Dec. 13, 1988
4,791,635
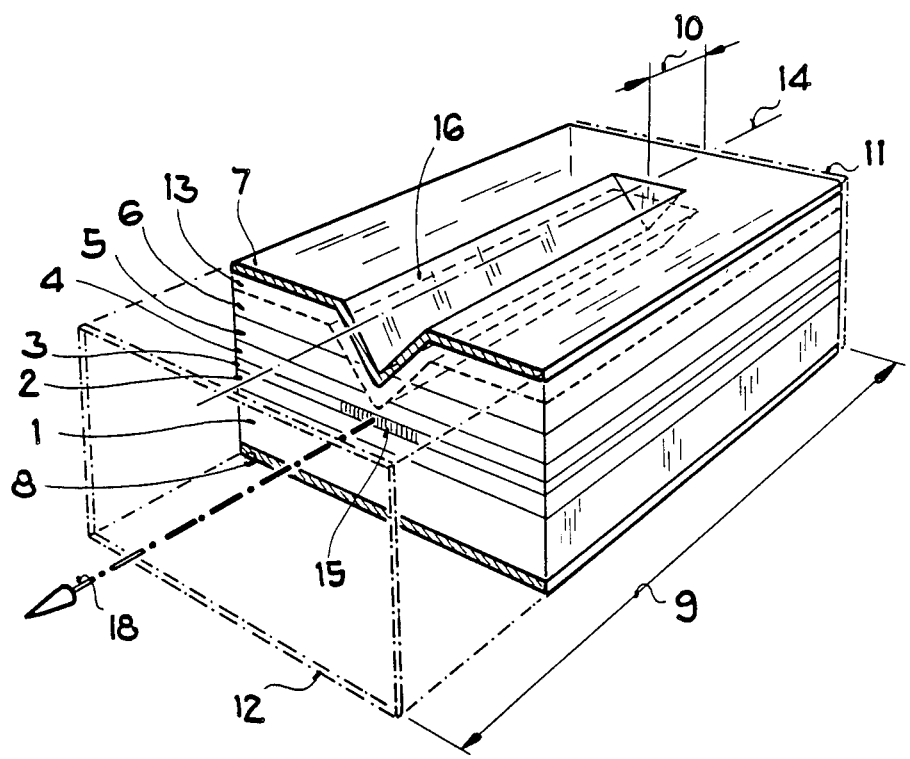

HETEROSTRUCTURE SEMICONDUCTOR LASER DIODE

BACKGROUND OF THE INVENTION

The invention relates to a heterostructure semiconductor laser diode with a layer sequence formed on a substrate, wherein a laser-active zone is arranged between layers of respectively opposite conductivity types wherein an additional layer and a cover layer of the same conductivity type as the substrate disposed thereon are formed on the side of the layer sequence facing away from the substrate, and wherein the cover layer includes an oppositely doped semiconductor area which penetrates, in a stripe-shaped surface zone extending perpendicularly to the exit surface of the laser radiation, through a v-groove-shaped recess in the area of the plane of symmetry, the boundary plane between the cover layer and the adjacent additional layer and extends into the layer located thereunder, whereby the current flowing in the forward direction of the semiconductor laser diode is confined to a narrow, strip-shaped area of the laser-active layer.

A heterostructure semiconductor laser diode with a v-groove-shaped recess is known from German Pat. No. 2,822,146. A solution is proposed therein for improved adaptation of a semiconductor laser to, for example, an optical fiber provided for light conduction, in particular, a single-mode optical fiber where there is an essentially linear connection between light characteristic and current characteristic.

In these conventional semiconductor lasers, the active area or strip is pumped up to the resonator mirrors. Heat is generated at the mirrors by surface recombination, and the overpopulation in the valence and/or conduction band is simultaneously reduced. As a result, the directly generated heat together with the absorption induced by the absence of overpopulation cause a gradual degradation of the mirrors with relatively low output power and a strong degradation with high output power.

SUMMARY OF THE INVENTION

The object underlying the present invention is, therefore, to provide a structure for a semiconductor laser diode with which degradation of the mirrors is avoided.

This object is attained in accordance with the invention in that in a heterostructure semiconductor laser diode of the type described above, the oppositely doped diffused semiconductor region extends into the upper layer adjacent the active layer but does not penetrate the active layer, the portion of the narrow, strip-shaped area of the laser-active zone which is beneath the v-groove shaped recess, and hence relevant to the pumping action of the laser, is shorter in its length-wise dimensions than the resonator length of the semiconductor laser diode in that the v-groove-shaped recess is shortened symmetrically relative to the resonator, thereby making it shorter in its longitudinal dimensions than the resonator length, and the laser-active layer is a highly doped layer of one conductivity type. with the features contained in the characterizing clause of claim 1.

It is expedient for the almost symmetrical shortening of the v-groove-shaped recess in relation to the resonator length to be approximately 5 to 15 μm and to be of the order of magnitude of two diffusion lengths of the charge carriers of the active layer.

The fundamental advantage of the semiconductor laser structure according to the invention is that a laser with higher output power and simultaneously improved long-term stability is thereby attained.

According to a further advantageous feature of the invention the laser active layer is highly n-doped.

An embodiment of the invention is illustrated in the drawing and will be described in greater detail hereinafter.

BRIEF DESCRIPTION OF THE DRAWING

The FIGURE is sectional view of a heterostructure semiconductor laser diode with a v-groove-shaped recess shortened in relation to the resonator length is shown in the drawing.

DETAILED DESCRIPTION OF THE PREFERRED EMBODIMENT

The FIGURE shows a substrate 1 consisting, for example, of GaAs, on which a sequence of layers 2 to 6 are grown, preferably by liquid-phase epitaxy, with the following compositions:

1. GaAs substrate, n-type, $n > 10^{18}$ cm$^{-3}$ thickness approximately 100 μm; orientation (100).
2. $Ga_{1-x}Al_xAs$ layer, n-type, $n \approx 2 \cdot 10^{17}$ cm$^{-3}$, $d \approx 4$ μm;
3. $Ga_{1-y}Al_yAs$ layer, n-type, $n = 1 \ldots 8 \cdot 10^{18}$ cm$^{-3}$, $d \leq 0.5$ μm;
4. $Ga_{1-x'}Al_{x'}As$ layer, p-type, $p \approx 2 \cdot 10^{17}$ cm$^{-3}$, $d \approx 1$ μm;
5. $Ga_{1-x''}Al_{x''}As$ layer, n-type, $n \approx 10^{17}$ cm$^{-3}$, $d \approx 0.5$ μm; and
6. GaAs layer, n-type, $n \approx 5 \cdot 10^{17}$ cm$^{-3}$, $d \approx 2$ μm.

Additionally shown are an ohmic contact 7, e.g., Ti/Pt/Au, for the cover layer 6 and an ohmic contact 8, e.g., Au:Ge alloy, for the substrate 1.

In the chosen Example, $x = x' = x'' = 0.35$ was selected.

The aluminum concentration and the stated doping values are merely typical values. The layer sequence 2 to 4 including the active layer 3, corresponds to the known double heterostructure in which the laser activity occurs upon current injection. Novel in this layer structure is the shortening of the v-groove-shaped recess 16 with simultaneous high doping of the laser-active layer 3.

Together, these two measures are beneficial to one another since the strip-shaped area 15 of the laser-active layer 3 is likewise made shorter than the resonator length 9 by the shortening of the v-groove-shaped recess 16, which results in avoidance of the otherwise customary surface recombination at the two mirrors 11 and 12. The absorption edge is shifted to a higher energy than that of the emission by the relatively high doping of the active layer 3. The unfavorable absorption of the emitted laser light is thereby avoided.

The symmetrical shortening of the v-groove-shaped recess 16 by distances 10 serves the purpose of making the laser-active layer 3 shorter in its longitudinal dimensions than the resonator length 9. Other measures are, however, also possible, for example, masking and/or doping areas of the semiconductor laser structure intended therefor to ensure that the strip-shaped area 15 of the laser-active layer is made distinctly shorter than the resonator length 9. Preferably, the extent of the shortening 10 of the recess 16 relative to the resonator length 9 is approximately 5–15μ and is in the order of magnitude of two diffusion lengths of the change carriers of the active layer 3.

The v-groove-shaped recess 16 is made by a photoresist mask and etching in the area of the plane of symmetry 14.

The mask for the exposure is adjusted on the (100) crystal surface so that the strips of the mask lie parallel to one (110) direction. This results in development of the etched flanks in the (111) crystal planes. In the subsequent diffusion, zinc, for example, is diffused, in accordance with a known process, into the entire surface or locally restricted to the area of the v-shaped groove, from the top surface to form a region 13 of a conductivity type opposite that of layer 6. On account of the structure of the top surface, the the region 13 with a diffusion front as indicated in the drawing is obtained. It is expedient for the diffusion depth of region 13 to be such that this front penetrates the additional layer 5 and extends into the layer 4 of the layer sequence 2, 4.

What is claimed is:

1. In a heterostructure semiconductor laser diode having a layer sequence formed on a substrate of one conductivity type (1), with the sequence including a laser-active zone (3) disposed between upper and lower layers (2, 4) of respectively opposite conductivity types, an additional layer (5) of the same conductivity type as the substrate (1) disposed on said upper layer on the side of the layer sequence facing away from the substrate, and a cover layer of the same conductivity type as the substrate disposed on said additional layer, and with said cover layer (6) including an oppositely doped diffused semiconductor region (13) which, in a stripe-shaped surface zone extending perpendicularly to the exit surface of the laser radiation in the area of the plane of symmetry (14) of the layer sequence, and through a v-groove-shaped recess (16) formed in said cover layer, penetrates the boundary plane between the cover layer (6) and the adjacent said additional layer (5) and extends into the said upper layer (4) located thereunder, whereby current flowing in the forward direction of the semiconductor laser diode is confined to a narrow, strip-shaped area (15) of the laser-active layer (3); the improvement wherein: said oppositely doped semiconductor region extends into said upper layer but does not penetrate said active layer; the portion of said narrow, strip-shaped area of the laser-active zone (3) which is beneath said v-groove shaped recess, and hence relevant to the pumping action of the laser, is shorter in its lemgth-wise dimensions than the resonator length (9) of the semiconductor laser diode in that the v-groove-shaped recess (16) is shortened symmetrically in relation to the resonator, thereby making it shorter in its longitudinal dimensions than the resonator length (9); and the laser-active layer (3) is a highly doped layer of one conductivity type.

2. Heterostructure semiconductor laser diode as defined in claim 1, wherein the laser-active layer (3) is highly n-doped.

3. A heterostructure semiconductor laser diode as defined in claim 2 wherein said substrate and said lower layer are n-doped.

4. A heterostructure semiconductor laser diode as defined in claim 1 wherein said lower layer is of the same conductivity type as said substrate.

5. A heterostructure semiconductor laser diode as defined in claim 4 wherein said active layer is of the same conductivity type as said lower layer.

6. A heterostructure semiconductor laser diode as defined in claim 1 wherein said active layer is highly doped relative to said upper and lower layers.

* * * * *